United States Patent
Kim

(10) Patent No.: US 9,484,510 B2
(45) Date of Patent: Nov. 1, 2016

(54) LENS AND LIGHT EMITTING MODULE FOR SURFACE ILLUMINATION

(71) Applicant: Seoul Semiconductor Co., Ltd., Ansan-si (KR)

(72) Inventor: Eun Ju Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/065,807

(22) Filed: Oct. 29, 2013

(65) Prior Publication Data

US 2014/0117394 A1    May 1, 2014

Related U.S. Application Data

(60) Provisional application No. 61/720,105, filed on Oct. 30, 2012.

(51) Int. Cl.
*H01L 33/58* (2010.01)
*G02B 19/00* (2006.01)

(52) U.S. Cl.
CPC ........... *H01L 33/58* (2013.01); *G02B 19/0014* (2013.01); *G02B 19/0061* (2013.01)

(58) Field of Classification Search
CPC .......... G02B 19/0061; G02B 19/0014; G02B 19/0028; H01L 33/58
See application file for complete search history.

(56) References Cited

U.S. PATENT DOCUMENTS

| | | |
|---|---|---|
| 8,016,451 B2 | 9/2011 | Householder et al. |
| 2004/0070855 A1 | 4/2004 | Benitez et al. |
| 2006/0044806 A1 | 3/2006 | Abramov et al. |
| 2008/0067531 A1* | 3/2008 | Chang ................. H01L 33/58 257/98 |
| 2009/0109687 A1* | 4/2009 | Householder et al. ....... 362/309 |
| 2009/0207586 A1 | 8/2009 | Arai et al. |
| 2011/0096553 A1 | 4/2011 | Shimokawa |
| 2011/0116272 A1* | 5/2011 | Bak et al. ................ 362/296.01 |
| 2011/0128745 A1 | 6/2011 | Chen et al. |
| 2012/0081618 A1* | 4/2012 | Matsui .......................... 348/790 |
| 2012/0120343 A1 | 5/2012 | Yamamoto |
| 2012/0153328 A1* | 6/2012 | Tsutsui ........................... 257/98 |
| 2013/0094218 A1* | 4/2013 | Wang et al. .............. 362/311.02 |

(Continued)

FOREIGN PATENT DOCUMENTS

| | | |
|---|---|---|
| EP | 2098905 | 9/2009 |
| EP | 2393131 | 9/2009 |

(Continued)

OTHER PUBLICATIONS

International Search Report issued on Feb. 17, 2014 in International Application No. PCT/KR2013/009689.
Written Opinion issued on Feb. 17, 2014 in International Application No. PCT/KR2013/009689.
Non-Final Office Action issued on Oct. 28, 2014, in U.S. Appl. No. 14/245,066.

(Continued)

*Primary Examiner* — Tucker J Wright
(74) *Attorney, Agent, or Firm* — H.C. Park & Associates, PLC

(57) ABSTRACT

An exemplary embodiment of the present invention discloses a light-emitting module including a circuit board, a light-emitting device disposed on the circuit board, and a lens disposed on the circuit board and configured to distribute light emitted from the light emitting device. The lens includes a concave portion having an incidence surface configured to receive incident light emitted from the light-emitting device, and the light emitting device is disposed within the concave portion of the lens.

17 Claims, 14 Drawing Sheets

(56) References Cited

U.S. PATENT DOCUMENTS

2013/0155690 A1 6/2013 Chen et al.
2013/0229808 A1* 9/2013 Wang .................. F21V 5/04
                                                        362/311.01
2014/0126222 A1 5/2014 Wang et al.

FOREIGN PATENT DOCUMENTS

| EP | 2325907 | 5/2011 |
| JP | 2007-208301 | 8/2007 |
| JP | 2011-096712 | 5/2011 |
| KR | 10-2011-0055867 | 5/2011 |

OTHER PUBLICATIONS

Notice of Allowance issued on Feb. 18, 2015, in U.S. Appl. No. 14/245,066.
European Search Report issued on Jul. 12, 2016 in European Patent Application No. PCT/KR2013009689.
Non-Final Office Action issued Sep. 24, 2015 in U.S. Appl. No. 14/804,690.
Final Office Action issued Apr. 20, 2016 in U.S. Appl. No. 14/804,690.
Non-Final Office Action issued Aug. 5, 2016, in U.S. Appl. No. 14/804,690.

* cited by examiner (a)

(b)

(a)

(b)

LENS AND LIGHT EMITTING MODULE FOR SURFACE ILLUMINATION

CROSS REFERENCE TO RELATED APPLICATION

This application claims the benefit of U.S. Provisional Patent Application No. 61/720,105, filed on Oct. 30, 2012, which is hereby incorporated by reference for all purposes as if fully set forth herein.

BACKGROUND

1. Field

Exemplary embodiments of the present invention relate to a light emitting module, and more particularly, to a lens for surface illumination and a light emitting module for surface illumination having the same.

2. Discussion of the Background

In general, a light emitting module for backlighting a liquid crystal display or a light emitting module for surface illumination, which is used in a surface illumination apparatus, includes a light emitting device mounted on a circuit board, and a lens for distributing light emitted from the light limiting device at a wide angle. By uniformly distributing the light emitted from the light emitting device using the lens, it is possible to uniformly irradiate a wide area with a small number of light emitting devices.

FIGS. 1A and 1B are respectively sectional and perspective views schematically illustrating a conventional light emitting module and a conventional lens.

Referring to FIGS. 1A and 1B, the light emitting module includes a circuit board 100, a light emitting device 200 and a lens 300. The circuit board 100 is a printed circuit board on which a circuit for supplying electric power to the light emitting device 200 is formed.

The light emitting device 200 generally includes a light emitting diode (LED) chip 210, a molding portion 230 covering the LED chip 210, and a package substrate 250. The molding portion 230 may include a phosphor used for converting the wavelength of light emitted from the LED chip 210 and have a lenticular shape. The package substrate 250 may have a recess for mounting the LED chip 210 therein. The light emitting device 200 is electrically connected to the circuit board 100.

Meanwhile, the lens 300 includes a lower surface 310 and an upper surface 350, and may also include a flange 370 and leg portions 390. The leg portions 390 are attached onto the circuit board 100, so that the lens 300 is disposed above the light emitting device 200. As shown in FIG. 1B, the leg portions 390 are usually comprised of three leg portions that are disposed at apexes of a regular triangle.

The lens 300 has an incidence surface 330 on which light from the light emitting device 200 is incident, and an exit surface 350 from which the light exits. The incidence surface 330 is an inner surface of a shell-shaped concave portion 320 formed on the lower surface 310 of the lens 300. Since the concave portion 320 is disposed above the light emitting device 200, light emitted from the light emitting device 200 is incident into the lens 300 through the incidence surface 330. The exit surface 350 allows the light incident into the lens 300 to exit over a wide viewing angle.

In the conventional light emitting module, the light emitted from the light emitting device 200 is distributed through the lens 300, so that uniform light can be achieved over a wider area. However, since the light emitting device 200 mounted on the circuit board 100 employs the package substrate 250, the size of the light emitting device 200 is relatively large. Accordingly, the entrance and height of the concave portion 320 for forming the incidence surface 330 of the lens 300 are also relatively larger, and as a result, it is difficult to slim the lens 300. Further, since the viewing angle of the light emitted from the light emitting device 200 is relatively narrow, there is a limitation on distribution of light through the lens 300.

Furthermore, since the light emitting device 200 is positioned beneath the lower surface 310 of the lens 300, a portion of the light emitted from the light emitting device 200 is not incident into the lens 300 but is likely to be lost beneath the lower surface 310 of the lens 300.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a technique for slimming a lens and a light emitting module for surface illumination.

Exemplary embodiments of the present invention also provide a lens and a light emitting module, which can reduce loss of light emitted from a light emitting device.

Exemplary embodiments of the present invention also provide a light emitting module which can provide uniform light over a wide area by employing a light emitting device suitable for surface illumination.

Additional features of the invention will be set forth in the description which follows, and in part will be apparent from the description, or may be learned by practice of the invention.

A light emitting module according to an exemplary embodiment of the present invention includes a circuit board, a light emitting device disposed on the circuit board, and a lens disposed on the circuit board, the lens configured to distribute light emitted from the light-emitting device. The lens includes a concave portion having an incidence surface configured to receive incident light emitted from the light-emitting device, and the light emitting device is disposed within the concave portion of the lens.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
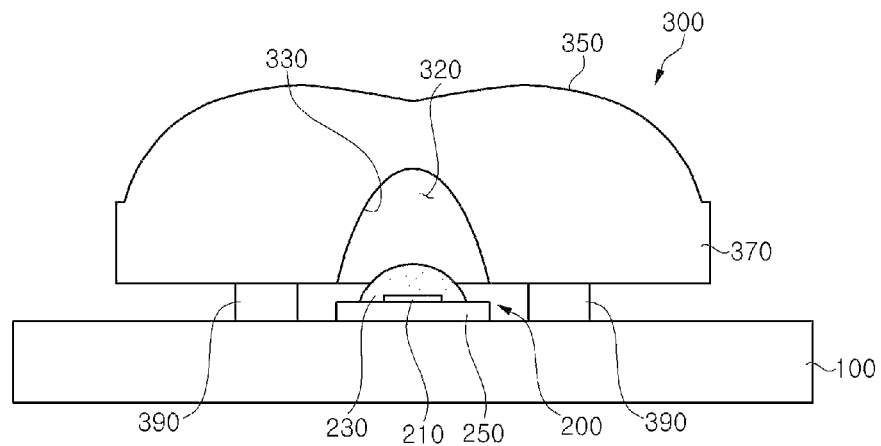
FIG. 1A is a sectional view illustrating a conventional light emitting module.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 2A:
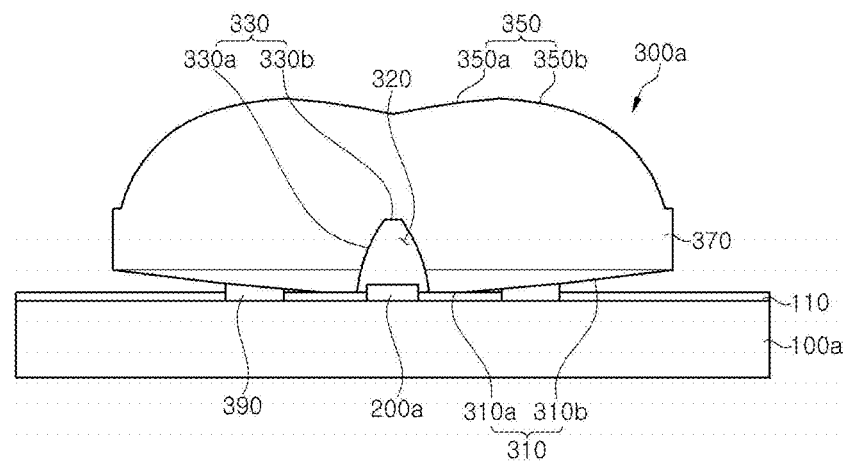
FIG. 2A is a sectional view illustrating a light emitting module according to an exemplary embodiment of the present invention.
Figure 2B:
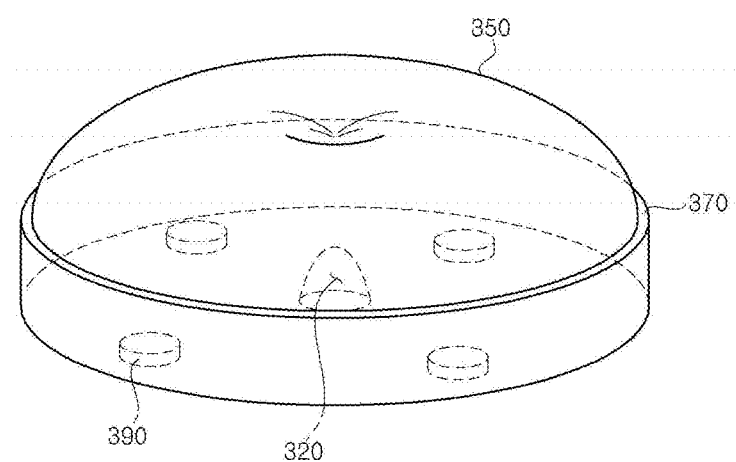
FIG. 2B is a perspective view of a lens employed in the light emitting module according to an exemplary embodiment of the present invention.
Figure 2C:
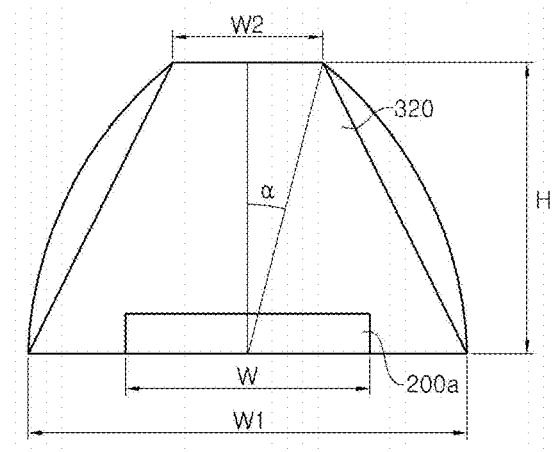
FIG. 2C is a schematic view illustrating the shape of a concave portion of the lens according to an exemplary embodiment of the present invention.
Figure 2D:
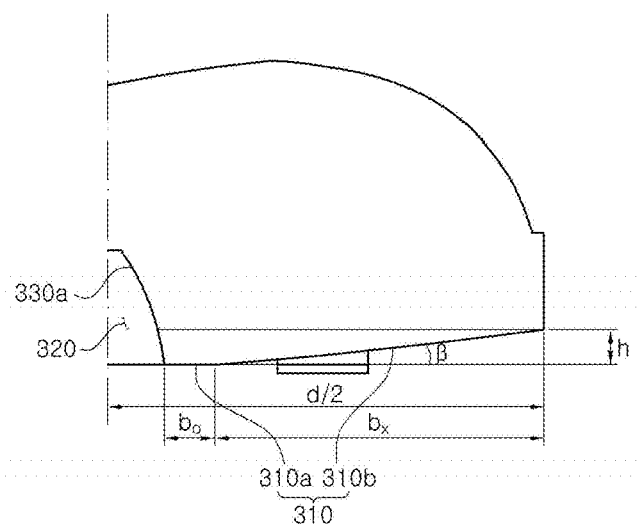
FIG. 2D is an enlarged sectional view of a portion of the lens employed in the light emitting module according to an exemplary embodiment of the present invention.

FIG. 2A is a sectional view illustrating a light emitting module according to an exemplary embodiment of the present invention. FIG. 2B is a perspective view of a lens 300a of the light emitting module. FIG. 2C is a schematic view illustrating a concave portion 320 of the lens 300a. FIG. 2D is an enlarged sectional view illustrating of a portion of a lower surface 310 of the lens 300a.

Referring to FIG. 2A, the light emitting module includes a circuit board 100a, a light emitting device 200a and a lens 300a. The light emitting module may further include a reflective sheet 110.

The circuit board 100a is a printed circuit board on which a circuit pattern is formed. Here, it is shown that one light emitting device 200a is mounted on the circuit board 100a. However, a plurality of light emitting devices 200a may be arranged on the circuit board 100a, and the lens 300a may be disposed above each of the light emitting devices 200a.

Unlike a conventional light emitting diode (LED) package, the light emitting device 200a does not have a chip-mounting member for mounting an LED chip, and is directly mounted on the circuit board 100a by flip bonding without using a bonding wire. That is, the circuit board 100a serves as a chip-mounting member for mounting an LED chip. Since the light emitting device 200a does not use a bonding wire, the light emitting device 200 does not require a molding portion for protecting the wire. A light emitting device 200a according to an exemplary embodiment of the present invention will be described in detail later with reference to FIG. 6.

The reflective sheet 110 is positioned between the lens 300a and the circuit board 100a. A white reflective material with high reflectance may be coated on the reflective sheet 110 so that the reflective sheet 110 can reflect light in a wide range of wavelengths of a visible region. The reflective sheet 110 reflects light, which travels toward the circuit board 100a, into the lens 300a.

The lens 300a includes a lower surface 310 and an upper surface 330, and may further include a flange 370 and leg portions 390. The lower surface 310 includes a concave portion 320, a flat surface 310a surrounding the concave portion 320, and an inclination surface 310b surrounding the flat surface 310a.

The concave portion 320 defines an incidence surface 330 through which light emitted from the light emitting device 200a is incident into the lens 300a. That is, the incident surface 330 is an inner surface of the concave portion 320. The incidence surface 330 includes a side surface 330a and an upper end surface 330b. The concave portion 320 has a shape narrowing as the concave portion 320 approaches upward from the entrance thereof. The side surface 330a may be an inclination surface having a constant slope from the entrance to the upper end surface 330b. Alternatively, the side surface 330a may be an inclination surface of which slope decreases from the entrance to the upper end surface 330b. That is, as shown in FIG. 2C, the side surface 330a is shown as a straight line or an upwardly convex curve in a vertical sectional view.

The light emitting device 200a is disposed substantially inside the concave portion 320. To this end, the width W1 of the entrance of the concave portion 320 is greater than the width w of the light emitting device 200a. The width W1 of the entrance of the concave portion 320 may be two times or less greater than the width w of the light emitting device 200a. In exemplary embodiments of the present invention, the light emitting device 200a has a relatively smaller size as compared with the conventional light emitting device 200, and thus, it is required to precisely align the light emitting device 200a and the lens 300a. Therefore, the width W1 of the entrance of the concave portion 320 is made to be no greater than two times than the width w of the light emitting device 200a, so that it is possible to prevent misalignment between the lens 300a and the light emitting device 200a. Further, since the light emitting device 200a becomes closer to the incidence surface 330, it is possible to reduce light escaping outside the concave portion 320. Particularly, the width of the entrance of the concave portion 320 may be no more than 3 mm or no more than 2 mm. Since the light emitting device 200a is disposed within the concave portion 320, most of the light emitted from the light emitting device 200a can be incident into the lens 300a, thereby reducing loss of light beneath a lower surface 310 of the lens 300a.

Meanwhile, the upper end surface 330b of the incidence surface 330 has a flat shape. The width W2 of the upper end surface 330b is smaller than the width W1 of the entrance and also smaller than the width w of the light emitting device 200a. The width W2 of the upper end surface 330b may be determined so that the angle a defined by a central axis of the concave portion 320 and a straight line connecting from the center of the entrance of the concave portion 320 to an edge of the upper end surface 330b is at least 3 degrees, preferably no less than 6 degrees. In the light emitted from the light emitting device 200a, light having a viewing angle in a range of +15 to −15 degrees is caused to be incident on at least the upper end surface 330b, thereby improving the distribution of light.

The upper end surface 330b prevents a substantial change in directivity distribution of light exiting outside of the lens 300a from occurring when the central axes of the light emitting device 200a and the lens 300a are not precisely aligned.

Meanwhile, the height H of the concave portion 320 may be adjusted depending on the viewing angle of the light emitting device 200c, the shape of the upper surface 350 of the lens 300a, a desired directivity distribution of light, and the like. However, in this embodiment, the height H of the concave portion 320 may have a relatively smaller value as compared with the conventional lens, since the width W1 of the entrance of the concave portion 320 decreases. Particularly, the height H of the concave portion 320 may be smaller than the thickness of the flange 370.

Referring back to FIG. 2A, the upper surface 350 of the lens 300a has a shape for distributing the light incident into the lens 300a so as to have a wide directivity distribution. For example, the upper surface 350 of the lens 300a may have a concave surface 350a positioned close to the central axis of the lens 300a and a convex surface 350b continuing from the concave surface 350a. The concave surface 350a allows light traveling toward the central axis of the lens 300a to be distributed outwardly, and the convex surface 350b increases the amount of light exiting outside the central axis of the lens 300a.

Meanwhile, the flange 370 connects the upper and lower surfaces 350 and 310 to each other and defines the external size of the lens 300a. Concavo-convex patterns may be formed on a side surface of the flange 370 and the lower surface 310. Meanwhile, the leg portions 390 of the lens 300a are coupled to the circuit board 100a so as to fix the lens 300a thereto. Respective tips of the leg portions 390 may be bonded to the circuit board 100a, for example, by an adhesive, or may be fitted into holes formed in the circuit board 100a.

As shown in FIG. 2B, the leg portions 390 may be comprised of four leg portions. However, the leg portions 390 may be comprised of three leg portions, as known in the related art. The leg portions 390 may be formed on the inclination surface 310b as shown in FIG. 2D.

Referring to FIGS. 2A and 2D, the lower surface 310 of the lens 300a has the flat surface 310a surrounding the concave portion 320, and the inclination surface 310b surrounding the flat surface 310a. The flat surface 310a is in close contact with the circuit board 100a or reflective sheet 110, and thus, it is possible to prevent loss of light at the lower surface 310 of the lens 300a. In FIG. 2D, the radius of the lens 300a is denoted by d/2, the length of the flat surface 310a from the incidence surface 330a to the inclination surface 310b is denoted by b0, and the radial length of the inclination surface 310b is denoted by bx.

Figure 15:
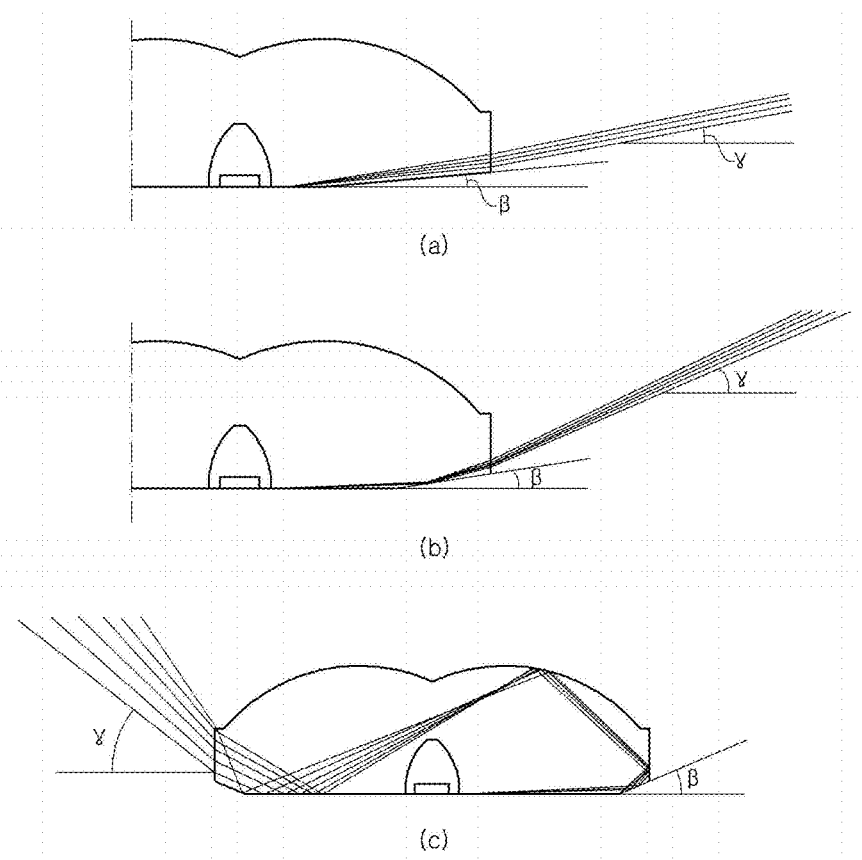
FIGS. 15(a), (b) and (c) are schematic views illustrating exit directions of light depending on various slopes of an inclination surface of a lower surface of the lens.
Figure 16:
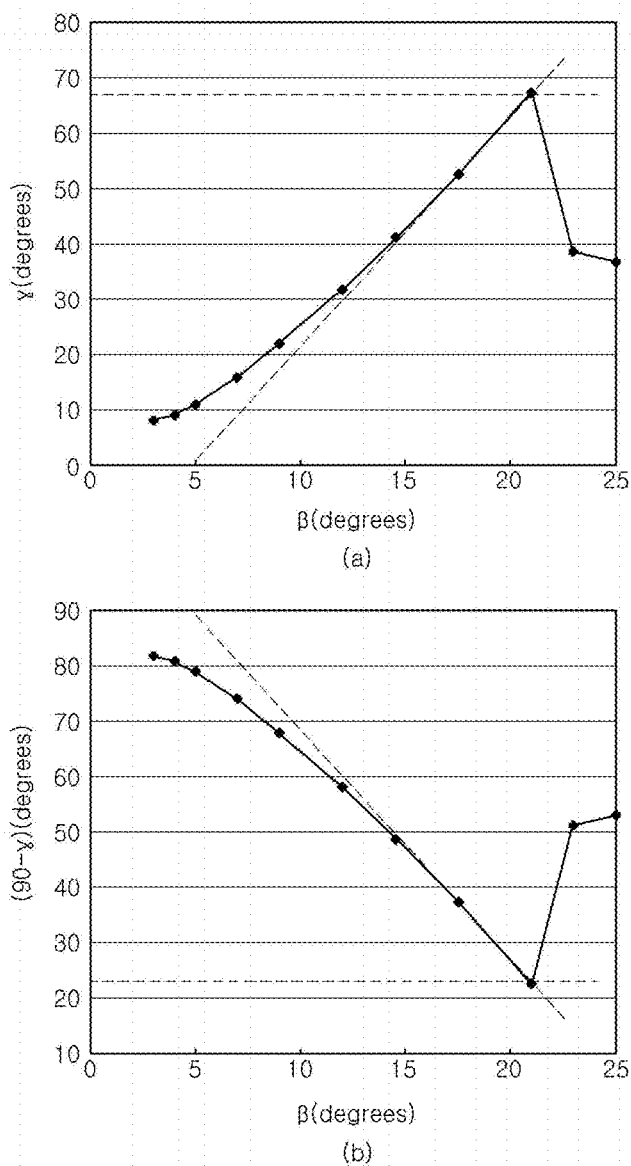
FIGS. 16(a) and (b) are graphs showing exit angles of light depending on various slopes of the inclination surface of the lower surface of the lens.

The inclination surface 310b is inclined upward at an inclination angle β with respect to the flat surface 310a. The inclination surface 310b continues up to the side surface of the lens 300, e.g., the side surface of the flange 370. Therefore, the side surface of the lens 300a is positioned at a height h with respect to the flat surface 310a. The inclination angle β of the inclination surface 310b is preferably less than 10 degrees. This will be described in detail later with reference to FIGS. 15 and 16. With the use of the inclination surface 310b, it is possible to reduce loss of light due to total internal reflection inside the lens 300a and to distribute light with a wide directivity distribution.

Figure 3:
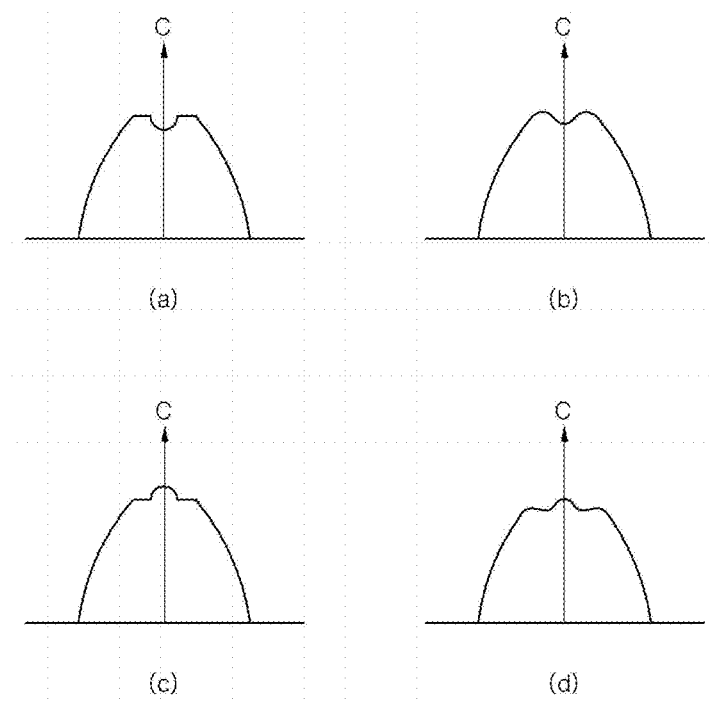
FIG. 3 shows sectional views illustrating different variations of the lens.

FIG. 3 shows sectional views illustrating different variations of the lens. Here, different variations of the concave portion 320 of FIG. 1 will be described.

Figure 1B:
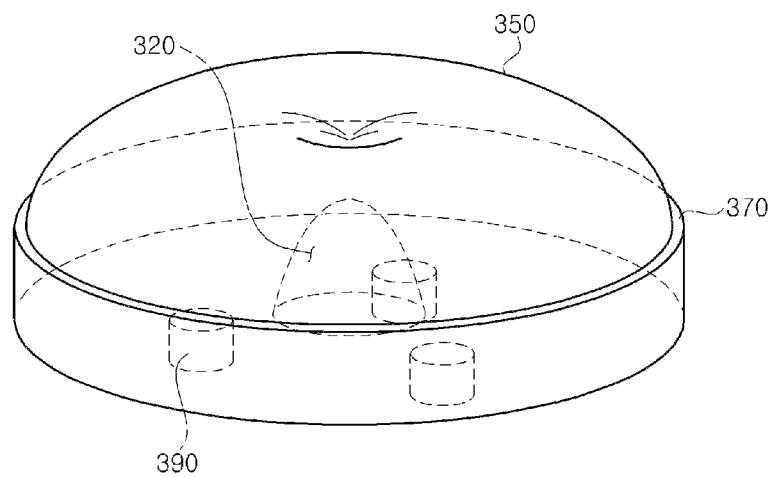
FIG. 1B is a perspective view of a lens employed in the conventional light emitting module.

In FIG. 3(a), a portion near the central axis C of the lens 300a in the upper end surface 330b described with reference to FIG. 1 forms a downwardly convex surface. Light incident toward the central axis C can be primarily controlled by this convex surface.

FIG. 3(b) is similar to FIG. 3(a) but is different from FIG. 3(a) in that a surface perpendicular to the central axis C in the upper end surface of FIG. 3(a) is formed to be upwardly convex. Upwardly and downwardly convex surfaces are mixed in the upper end surface, and thus, it is possible to reduce a change in the directivity distribution of light due to an alignment error between the light emitting device and the lens.

In FIG. 3(c), a portion near the central axis C in the upper end surface 330b described with reference to FIG. 1 forms an upwardly convex surface. Light toward the central axis C can be further distributed by this convex surface.

FIG. 3(d) is similar to FIG. 3(c) but is different from FIG. 3(c) in that the surface perpendicular to the central axis C in the upper end surface of FIG. 3(c) is formed to be downwardly convex. Upwardly and downwardly convex surfaces are mixed in the upper end surface, and thus, it is possible to reduce a change in the directivity distribution of light due to an alignment error between the light emitting device and the lens.

Figure 4:
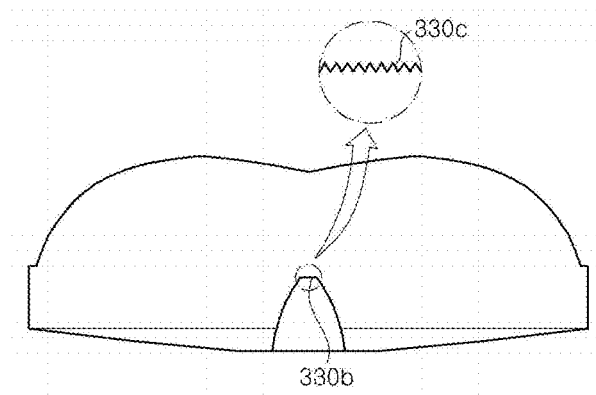
FIG. 4 is a sectional view illustrating a further variation of the lens.

FIG. 4 is a sectional view illustrating a further variation of the lens according to an exemplary embodiment of the present invention.

Referring to FIG. 4, a light-scattering pattern 330c is formed on the upper end surface 330b. The light-scattering pattern 330c may be formed as a concavo-convex pattern.

Generally, relatively much light flux is concentrated near the central axis of the lens. Moreover, in the exemplary embodiments of the present invention, the upper end surface 330b is a surface perpendicular to the central axis, and thus, light flux can be further concentrated near the central axis. Thus, the light-scattering pattern 330c is formed on the upper end surface 330b, thereby distributing the light flux near the central axis. Thus, even though the central axes of the light emitting device 200a and the lens 300a are misaligned, it is possible to reduce influence of the misalignment on the directivity distribution of light. Accordingly, an alignment tolerance between the light emitting device 200a and the lens 300a is increased.

Figure 5:
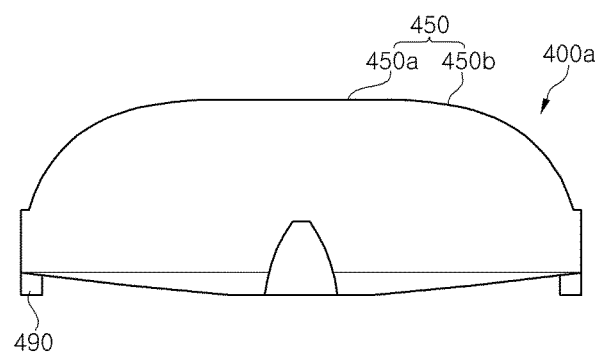
FIG. 5 is a sectional view illustrating a still further variation of the lens.

FIG. 5 is a sectional view illustrating a still further variation of the lens.

Referring to FIG. 5, the lens 400a according to this variation is generally similar to the lens 300a described with reference to FIGS. 2A to 2D but is different from the lens 300a in view of the shape of an upper surface 450 and the positions of leg portions 490. That is, instead of the concave surface 350a in FIG. 2A, a relatively flat surface 450a is disposed near the central axis of the lens 400a, and a convex surface 450b continues outwardly from the flat surface 450a. The leg portions 490 are disposed near a side surface of the lens 400a.

The shape of the lens may be variously modified in consideration of a desired directivity distribution of light, and the like.

Figure 6:
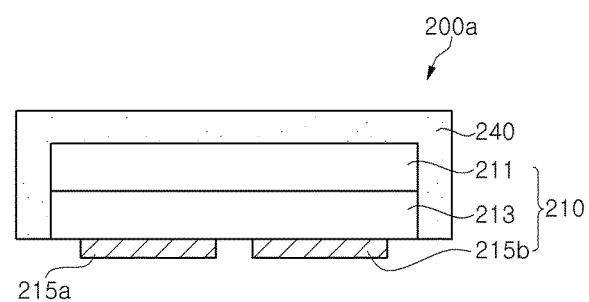
FIG. 6 is a schematic sectional view illustrating a light emitting device according to an exemplary embodiment of the present invention.

FIG. 6 is a schematic sectional view illustrating a light emitting device 200a according to an exemplary embodiment of the present invention.

Referring to FIG. 6, the light emitting device 200a includes an LED chip 210 and a wavelength conversion layer 240. The LED chip 210 includes a substrate 211 and a semiconductor stack 213, and may further include electrode pads 215a and 215b.

The LED chip 210 is a flip chip and has the electrode pads 215a and 215b positioned at a lower portion of the LED chip 210. The width w of the LED chip 210 may be in a range of about 0.7 to 1.5 mm.

The substrate 211 may be a growth substrate used for growing a semiconductor layer, for example, a sapphire substrate or gallium nitride (GaN) substrate. Particularly, in a case where the substrate 211 is a sapphire substrate, refractive indices gradually decrease in the order of the semiconductor stack 213, the sapphire substrate 211 and the wavelength conversion layer 240, thereby improving light extraction efficiency. In a specific embodiment, the substrate 211 may be omitted.

The semiconductor stack 213 is formed of a GaN-based compound semiconductor and can emit ultraviolet or blue light.

The LED chip 210 is mounted directly on the circuit board 100a. The LED chip 210 is connected directly to a printed circuit on the circuit board 100a by flip bonding without using a bonding wire. In an exemplary embodiment of the present invention, a wire is not used when the LED chip is bonded to the circuit board 100a. Hence, a molding portion for protecting a wire is not required, and it is also not required to remove a portion of the wavelength conversion layer 240 so as to expose a bonding pad. Thus, employing the flip-chip type LED chip 210 enables elimination of a phenomenon such as color deviation or luminance specks and simplification of a module fabricating process as compared with an LED chip using a bonding wire.

A flip-chip type LED chip according to an exemplary embodiment of the present invention will be described in detail later with reference to FIGS. 7 to 12.

Meanwhile, the wavelength conversion layer 240 covers the LED chip 210. As shown in FIG. 6, a conformal-coated wavelength conversion layer 240, e.g., a phosphor layer, can be formed on the LED chip 210 and perform wavelength conversion of light emitted from the LED chip 210. The wavelength conversion layer 240 is coated on the LED chip 210, and may cover top and side surfaces of the LED chip 210. In a specific embodiment, the wavelength conversion layer 240 may cover only the top surface of the LED chip 210. Light with various colors can be realized using the light emitted from the LED chip 210 and the wavelength conversion layer 240. Particularly, mixed light such as white light can be realized.

In this embodiment, the conformal-coated wavelength conversion layer 240 may be previously formed on the LED chip 210 so as to be mounted together with the LED chip 210 on the circuit board 100a.

Hereinafter, a method of fabricating the LED chip 210 will be described for better understanding of the LED chip 210.

FIGS. 7 to 11 are views illustrating a method of fabricating a flip-chip type LED chip according to an exemplary embodiment of the present invention, wherein (a) of each of these figures is a plan view and (b) thereof is a sectional view taken along line A-A.

Figure 7:
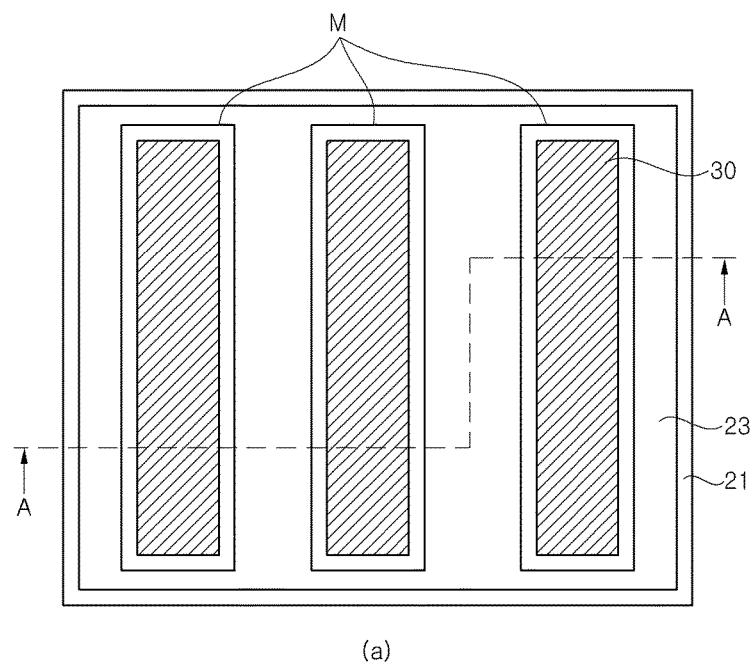
FIGS. 7(a), 7(b), 8(a), 8(b), 9(a), 9(b), 10(a), 10(b), 11(a), 11(b), and 12 are views illustrating a method of fabricating a light emitting diode (LED) chip that can be used in the light emitting device according to an exemplary embodiment of the present invention, wherein (a) of each of these figures shows a plan view and (b) thereof shows a sectional view taken along line A-A.
Figure 7:
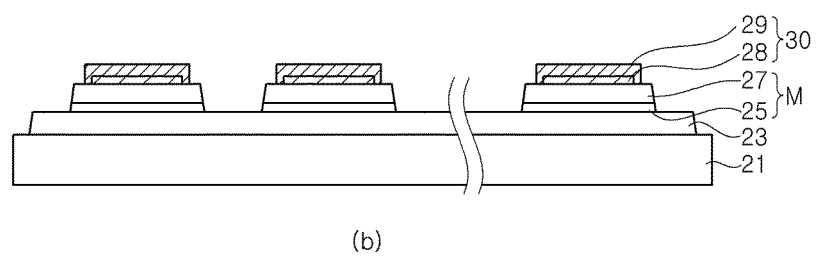

Referring to FIG. 7, a first conductive semiconductor layer 23 is formed on a growth substrate 21, and a plurality of mesas M spaced apart from one another is formed on the first conductive semiconductor layer 23. Each of the plurality of mesas M includes an active layer 25 and a second conductive semiconductor layer 27. The active layer 25 is positioned between the first and second conductive semiconductor layers 23 and 27. Meanwhile, reflective electrodes 30 are positioned on the plurality of mesas M, respectively.

The plurality of mesas M may be formed by growing an epitaxial layer including the first conductive semiconductor layer 23, the active layer 25 and the second conductive semiconductor layer 27 on the growth substrate 21 using a metal organic chemical vapor growth technique or the like, and then by patterning the second conductive semiconductor layer 27 and the active layer 25 so that the first conductive semiconductor layer 23 is exposed. Side surfaces of the plurality of mesas M may be formed to be inclined using a technique such as photoresist reflow. The profile of the inclined side surface of the mesa M improves the extraction efficiency of light generated in the active layer 25.

The plurality of mesas M may have an elongated shape extending in parallel with one another in one direction as shown in this figure. Such a shape simplifies formation of the plurality of mesas M having the same shape in a plurality of chip regions on the growth substrate 21.

Meanwhile, although the reflective electrodes 30 may be formed on the respective mesas M after the plurality of mesas M are formed, the present invention is not limited thereto. That is, the reflective electrodes 30 may be previously formed on the second conductive semiconductor layer 27 before the mesas M are formed after the second conductive semiconductor layer 27 is formed. The reflective electrode 30 covers most of the top surface of the mesa M, and has a shape generally identical to the planar shape of the mesa M.

Each of the reflective electrodes 30 includes a reflective layer 28 and may further include a barrier layer 29. The barrier layer 29 may cover top and side surfaces of the reflective layer 28. For example, the barrier layer 29 may be formed to cover the top and side surfaces of the reflective layer 28 by forming a pattern of the reflective layer 28 and then forming the barrier layer 29 thereon. For example, the reflective layer 28 may be formed by vapor-depositing and patterning an Ag, Ag alloy, Ni/Ag, NiZn/Ag or TiO/Ag layer. The barrier layer 29 may be formed of a layer of Ni, Cr, Ti, Pt, Rd, Ru, W, Mo, TiW or composites thereof, and prevents a metallic material of the reflective layer 28 from being diffused or contaminated.

After the plurality of mesas M has been formed, edges of the first conductive semiconductor layer 23 may be etched. Accordingly, portions of an upper surface of the substrate 21 can be exposed. The side surface of the first conductive semiconductor layer 23 may also be formed inclined.

Figure 12:
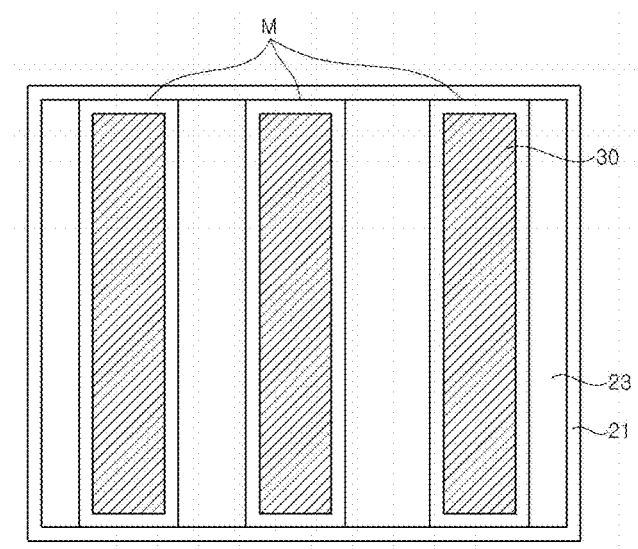

The plurality of mesas M may, as shown in FIG. 7, be formed to be restricted only within and positioned in an upper region of the first conductive semiconductor layer 23. That is, the plurality of mesas M may be positioned in the form of islands on the upper region of the first conductive semiconductor layer 23. Alternatively, as shown in FIG. 12, the mesas M extending in one direction may be formed to reach an upper edge of the first conductive semiconductor layer 23. That is, one edge of the lower surface of each of the plurality of mesas M corresponds to one edge of the first conductive semiconductor layer 23. Accordingly, the upper surface of the first conductive semiconductor layer 23 is divided by the plurality of mesas M.

Figure 8:
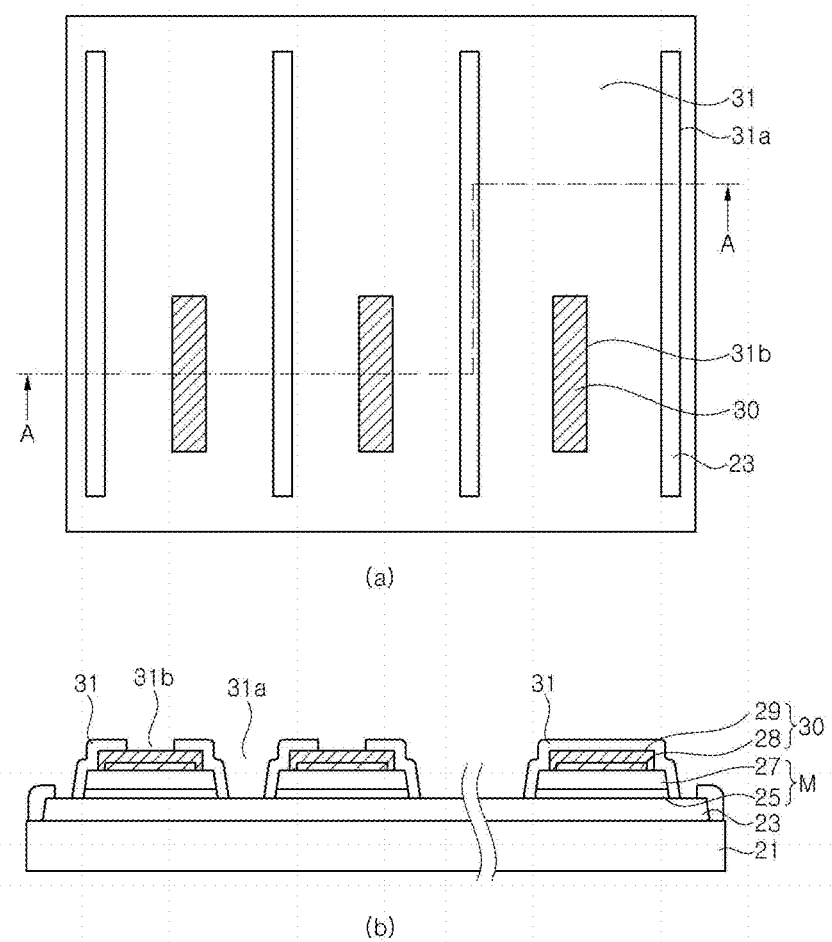

Referring to FIG. 8, a lower insulating layer 31 is formed to cover the plurality of mesas M and the first conductive semiconductor layer 23. The lower insulating layer 31 has openings 31a and 31b for allowing electrical connections to the first and second conductive semiconductor layers 23 and 27 in a specific region. For example, the lower insulating layer 31 may have openings 31a for exposing the first conductive semiconductor layer 23 therethrough and openings 31b for exposing the reflective electrodes 30 are exposed therethrough.

The openings 31a may be positioned in regions between the mesas M and near edges of the substrate 21, and may have an elongated shape extending along the mesas M. The openings 31b are restricted only on and positioned at upper portions of the respective mesas M, and are positioned to be biased toward the same side of ends of the mesas M.

The lower insulating layer 31 may be formed of a layer of oxides such as $SiO_2$, a layer of nitrides such as SiNx, or a layer of insulative materials such as SiON or $MgF_2$ using a technique such as chemical vapor deposition (CVD). The lower insulating layer 31 may be formed to have a single-layered structure but is not limited thereto. That is, the lower insulating layer 31 may be formed to have a multi-layered structure. Further, the lower insulating layer 31 may be formed of a distributed Bragg reflector (DBR) in which layers of materials with low and high refractive indices are alternately laminated. For example, layers of dielectrics such as $SiO_2/TiO_2$ or $SiO_2/Nb_2O_5$ are laminated to form an insulating reflective layer having high reflectance.

Figure 9:
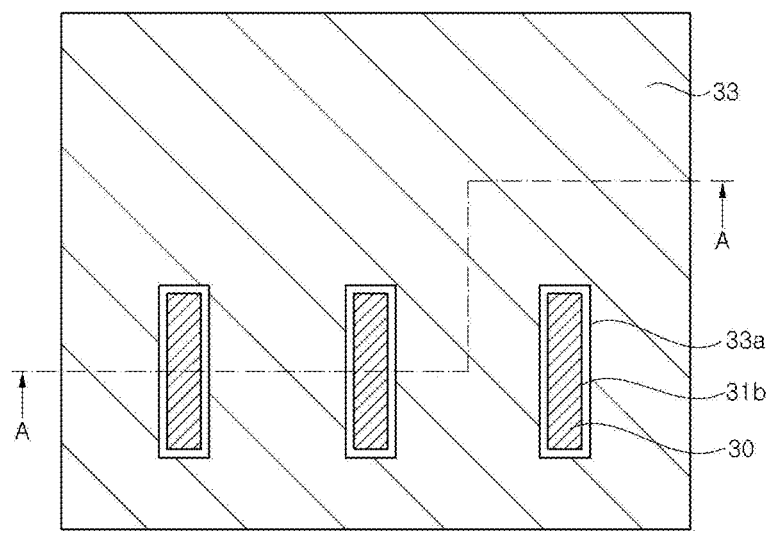
Figure 9:
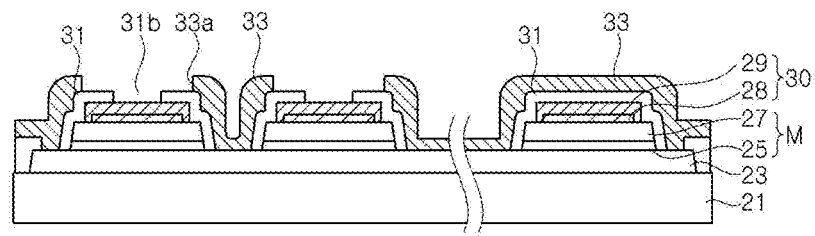

Referring to FIG. 9, a current-spreading layer 33 is formed on the lower insulating layer 31. The current-spreading layer 33 covers the plurality of mesas M and the first conductive semiconductor layer 23. The current-spreading layer 33 has openings 33a which are positioned respectively in upper regions of the mesas M and expose the reflective electrodes therethrough. The current-spreading layer 33 may be in ohmic-contact with the first conductive semiconductor layer 23 through the openings 31a of the lower insulating layer 31. The current-spreading layer 33 is insulated from the plurality of mesas M and the reflective electrodes 30 by the lower insulating layer 31.

Each of the openings 33a of the current-spreading layer 33 has an area larger than that of each of the openings 31b of the lower insulating layer 31 so as to prevent the current-spreading layer 33 from being connected to the reflective electrodes 30. Thus, side walls of the openings 33a are positioned on the lower insulating layer 31.

The current-spreading layer 33 is formed on the almost entire region of the substrate 31 except for the openings 33a. Thus, an electrical current can be easily distributed through the current-spreading layer 33. The current-spreading layer 33 may include a highly-reflective metal layer such as an Al layer, and the highly-reflective metal layer may be formed on an adhesion layer of Ti, Cr or Ni. A protective layer with a single-layered or composite-layered structure of Ni, Cr, Au and the like may be formed on the highly-reflective metal layer. The current-spreading layer 33 may have a multi-layered structure of Ti/Al/Ti/Ni/Au.

Figure 10:
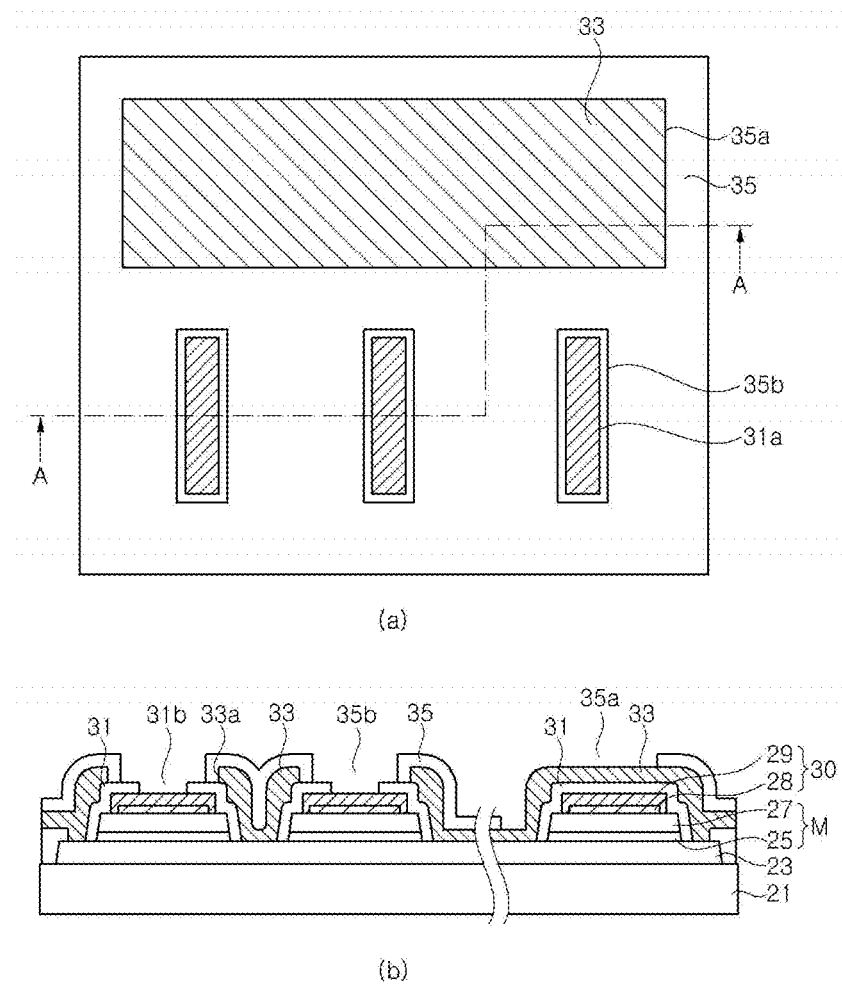

Referring to FIG. 10, an upper insulating layer 35 is formed on the current-spreading layer 33. The upper insulating layer 35 has openings 35b for exposing the respective reflective electrodes 30 therethrough, together with an opening 35a for exposing the current-spreading layer 33 therethrough. The opening 35a may have a shape that is elongated in a direction perpendicular to the direction of the length of the mesa M, and has an area relatively larger than those of the openings 31b. The openings 35b expose the reflective electrodes 30 that are exposed through the openings 33a of the current-spreading layer 33 and the openings 31b of the lower insulating layer 31. The openings 35b may have areas narrower than those of the openings 33a of the current-spreading layer 33 but wider than those of the openings 31b of the lower insulating layer 31. Accordingly, the side walls of the openings 33a of the current-spreading layer 33 can be covered by the upper insulating layer 35.

The upper insulating layer 35 may be formed using an insulating layer of oxides, an insulating layer of nitrides, or a mixed or alternating layer thereof; or using a polymer such as polyimide, Teflon or parylene.

Figure 11:
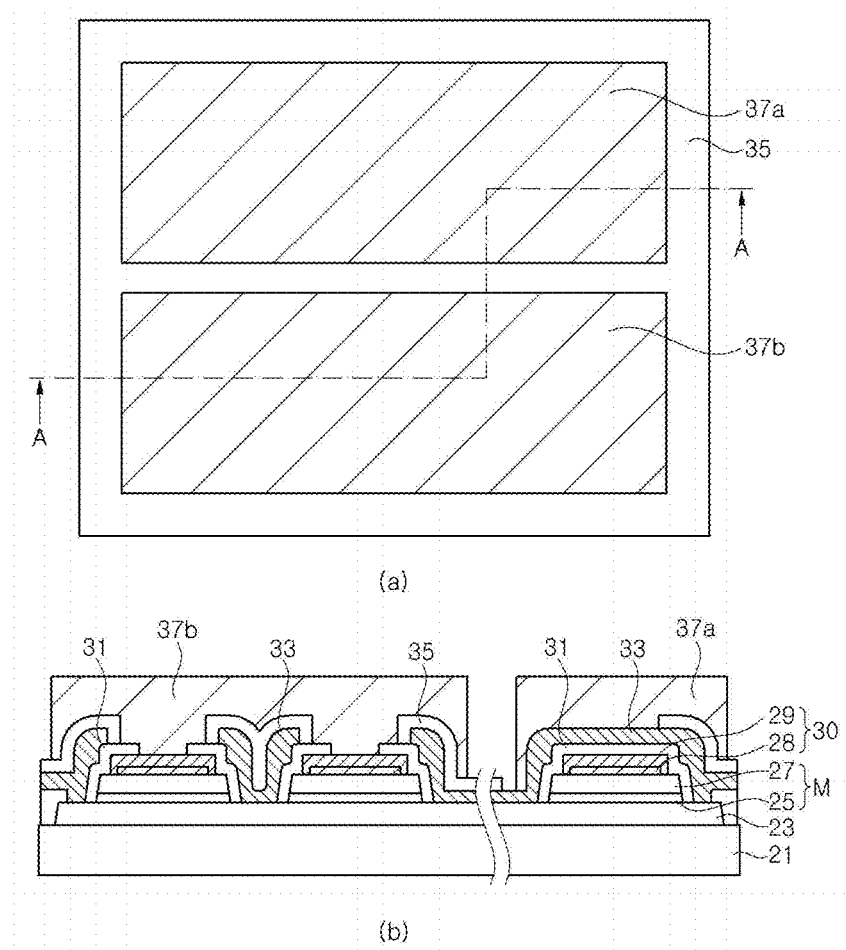

Referring to FIG. 11, first and second pads 37a and 37b are formed on the upper insulating layer 35. The first pad 37a is connected to the current-spreading layer 33 through the opening 35a of the upper insulating layer 35, and the second pad 37b is connected to the reflective electrodes 30 through the openings 35b of the upper insulating layer 35. The first and second pads 37a and 37b may be used as pads for connecting bumps or for applying a surface mounting technology (SMT) in order to mount LEDs on a circuit board or the like.

The first and second pads 37a and 37b may be formed together in the same process. For example, the first and second pads 37a and 37b may be formed using a photolithography technique or lift-off technique. The first and second pads 37a and 37b may include, for example, an adhesion layer of Ti, Cr, Ni or the like, and a highly-conductive metal layer of Al, Cu, Ag, Au or the like. The first and second pads 37a and 37b may be formed such that their ends are positioned on the same plane. Thus, LED chips can be flip-bonded on the respective conductive patterns formed at the same height on the circuit board 100a to 100d. In addition, the first and second pads 37a and 37b may be formed to have the same shape and size, and thus, flip-chip bonding can be easily performed.

Subsequently, the growth substrate 21 is divided on an individual LED chip basis, thereby completing LED chips. The growth substrate 21 may be removed from the LED chips before or after it is divided on the individual LED chip basis.

Hereinafter, the structure of an LED chip according to an exemplary embodiment of the present invention will be described in detail with reference to FIG. 11.

The LED chip includes a first conductive semiconductor layer 23, mesas M, reflective electrodes 30 and a current-spreading layer 33, and may further include a growth substrate 21, a lower insulating layer 31, an upper insulating layer 35 and first and second pads 37a and 37b.

The substrate 21 may be a growth substrate for growing a GaN-based epitaxial layer, e.g., a sapphire substrate or GaN substrate. The substrate 21 is, for example, a sapphire substrate, and may have a thickness of 200 μm or more and preferably 250 μm or more.

The first conductive semiconductor layer 23 is continuous, and the plurality of mesas M is positioned to be spaced apart from one another on the first conductive semiconductor layer 23. Each of the mesas M includes an active layer 25 and a second conductive semiconductor layer 27, as described with reference to FIG. 7, and has an elongated shape extending in one direction. Here, the mesa M has a stack of GaN-based compound semiconductors. The mesa M may be restricted only within and positioned in an upper region of the first conductive semiconductor layer 23, as shown in FIG. 7. Alternatively, the mesa M may extend up to edges of an upper surface of the first conductive semiconductor layer 23 in one direction, as shown in FIG. 12, and thus, can partition the upper surface of the first conductive semiconductor layer 23 into a plurality of regions. Accordingly, it is possible to prevent an electrical current from being concentrated near corners of the mesas M, thereby further reinforcing current-distributing performance.

The reflective electrodes 30 are positioned on the plurality of mesas M, respectively, and are in ohmic contact with the second conductive semiconductor layer 27. Each of the reflective electrodes 30 may include a reflective layer 28 and a barrier layer 29, and the barrier layer 29 may cover top and side surfaces of the reflective layer 28, as described in FIG. 7. Accordingly, it is possible to prevent the reflective layer 28 from being exposed outwardly, thereby preventing deterioration of the reflective layer 28.

The current-spreading layer 33 covers the plurality of mesas M and the first conductive semiconductor layer 23. The current-spreading layer 33 has openings 33a which are positioned respectively in upper regions of the mesas M and expose the reflective electrodes 30 therethrough. The current-spreading layer 33 is also in ohmic contact with the first conductive semiconductor layer 23, and is insulated from the plurality of mesas M. The current-spreading layer 33 may include a reflective metal such as Al. Accordingly, in addition to light reflection caused by the reflective electrodes 30, it is possible to obtain light reflection caused by the current-spreading layer 33. Thus, it is possible to reflect light that travels through side walls of the plurality of mesas M and the first conductive semiconductor layer 23.

The current-spreading layer 33 may be insulated from the plurality of mesas M by the lower insulating layer 31. For example, the lower insulating layer 31 is positioned between the plurality of mesas M and the current-spreading layer 33, so that the current-spreading layer 33 can be insulated from the plurality of mesas M. The lower insulating layer 31 may have openings 31b which are positioned respectively in the upper regions of the mesas M and expose the reflective electrodes 30 therethrough, and may also have openings 31a through which the first conductive semiconductor layer 23 is exposed. The current-spreading layer 33 may be connected to the first conductive semiconductor layer 23 through the openings 31a. Each of the openings 31b of the lower insulating layer 31 has an area narrower than that of each of the openings 33a of the current-spreading layer 33, and the openings 31b are fully exposed by the openings 33a.

The upper insulating layer 35 covers at least a portion of the current-spreading layer 33. The upper insulating layer 35 has openings 35b for exposing the reflective electrodes 30 therethrough. Further, the upper insulating layer 35 may have an opening 35a through which the current-spreading layer 33 is exposed. The upper insulating layer 35 may cover side walls of the openings 33a of the current-spreading layer 33.

The first pad 37a may be positioned on the current-spreading layer 33. For example, the first pad 37a may be connected to the current-spreading layer 33 through the opening 35a of the upper insulating layer 35. The second pad 37b is connected to the reflective electrodes 30 through the openings 35b of the upper insulating layer 35. Upper ends of the first and second pads 37a and 37b may be positioned at the same height as shown in FIG. 11. Thus, it is possible to easily form a pad for connecting the reflective electrodes 30 exposed through the openings 35a of the current-spreading layer 33.

According to an exemplary embodiment of the present invention, the current-spreading layer 33 covers the mesas M and the substantially entire regions of the first conductive semiconductor layer 23 between the mesas M. Thus, an electrical current can be easily distributed through the current-spreading layer 33. Since the current-spreading layer covers the plurality of mesas M and the first conductive semiconductor layer 23, current-spreading performance is improved through the current-spreading layer 33.

Further, the current-spreading layer 33 includes a layer of a reflective metal such as Al, or the lower insulating layer 31 is formed as an insulating reflective layer, so that light not reflected by the reflective electrodes 30 can be reflected by the current-spreading layer 33 or the lower insulating layer 31, thereby improving light extraction efficiency.

The flip-chip type LED chip according to this embodiment can have a relatively wide directivity distribution.

Figure 13:
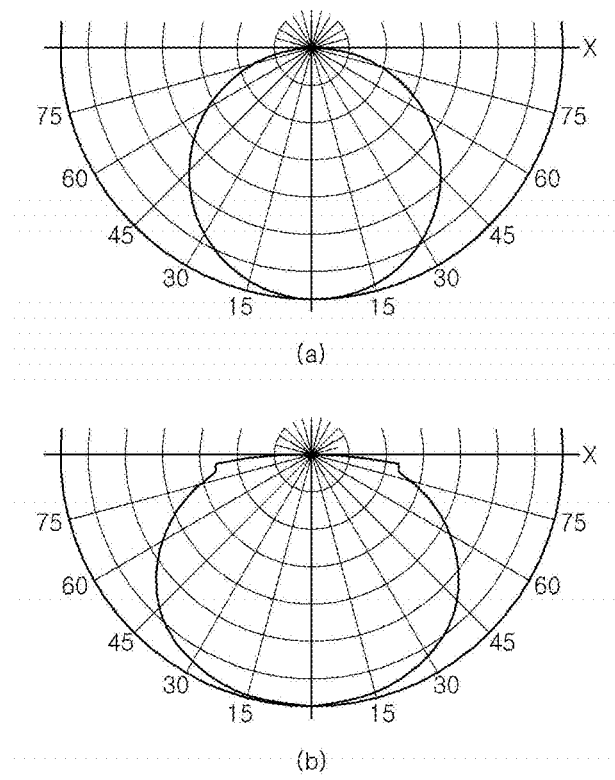
FIGS. 13(a) and (b) are graphs showing directivity distributions of a conventional LED package 200 and a flip-chip type LED chip having a conformal coating layer according to an exemplary embodiment of the present invention, respectively.

FIG. 13 shows graphs illustrating directivity distributions of the conventional LED package 200 and the light emitting device according to an exemplary embodiment of the present invention, i.e., the flip-chip type LED chip 210 having a conformal coating layer.

Referring to FIG. 13(a), the conventional LED package 200 has a viewing angle of about 120 degrees. On the other hand, the light emitting device of the present exemplary embodiment has a viewing angle of about 145 degrees as shown in FIG. 13(b). That is, it can be seen that the chip-level light emitting device according to an exemplary embodiment of the present invention has a viewing angle increased by 25 degrees as compared with the conventional package-level light emitting device.

Figure 14:
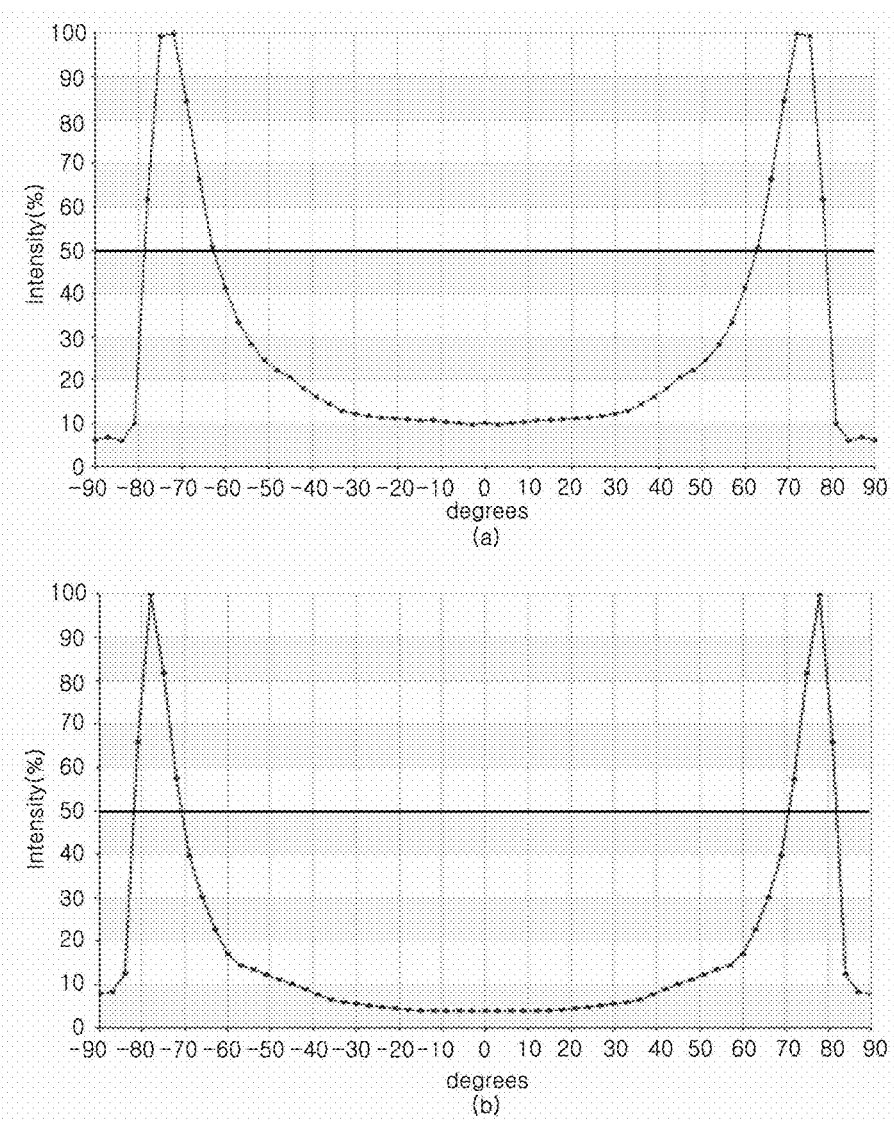
FIGS. 14(a) and (b) are graphs showing directivity distributions of a light emitting module using the conventional LED package and a light emitting module using the flip-chip type LED chip having the conformal coating layer according to an exemplary embodiment of the present invention, respectively.

FIG. 14(a) shows a directivity distribution of a light emitting module using the conventional LED package having a viewing angle of 120 degrees, and FIG. 14(b) shows a directivity distribution of a light emitting module using the flip-chip type LED chip 210 provided with the conformal coating layer having a viewing angle of 145 degrees according to an exemplary embodiment of the present invention. Here, a directivity distribution of light in one axis direction was simulated using a light emitting device and a lens having the same distribution of illumination intensity in each direction. The directivity distribution of light shows light intensity depending on a viewing angle at a point spaced apart by 5 m from each light emitting device. Here, the lower surface of the lens was entirely flat without the inclination surface 310b.

In these graphs, it is found that light is more widely and uniformly distributed as an angle between maximum light intensities becomes larger and as a ratio (C/P) of a light intensity at the center to the maximum light intensity becomes smaller. In FIG. 14(a), the angle between the maximum light intensities is 146 degrees, and the ratio of the light intensity at the center to the maximum light intensity is 10%. In FIG. 14(b), the angle and the ratio are 152 degrees and 4.5%, respectively. Upon comparison of angles at points with light intensity of 50%, the angle is 65 degrees in FIG. 14(a), and the angle is 70 degrees in FIG. 14(b). Thus, in a case where a light emitting module is fabricated using the flip-chip type LED chip 210 having the conformal coating layer according to exemplary embodiments of the present invention, the light emitting module according to exemplary embodiments of the present invention can more widely and uniformly distribute light than the conventional light emitting module.

FIGS. 15(a), (b) and (c) are schematic views illustrating exit directions of light depending on various slopes of the inclination surface 310b of the lower surface of the lens.

Beams of light exiting at angles, which were in a range of 0 to 3 degrees with respect to the flat surface 310a of the lower surface of the lens, below a side surface of the light emitting device 200a were simulated, and angles $\gamma$ made between the beams of light exiting from the lens 300a and the flat surface 310a of the lower surface of the lens were calculated.

In FIG. 15(a), an inclination angle $\beta$ was about 4 degrees, and the angle $\gamma$ of the beam of light exiting from the lens 300a was 9 degrees. Therefore, the exit angle (90−$\gamma$) with respect to the central axis of the lens was 81 degrees.

In FIG. 15(b), the inclination angle $\beta$ was about 9.5 degrees, and the angle $\gamma$ of the beam of light exiting from the lens 300a was 24 degrees. Therefore, the exit angle (90−$\gamma$) with respect to the central axis of the lens was 66 degrees.

In FIG. 15(c), the inclination angle $\beta$ was about 23 degrees, and the beam of light exiting from the lens 300a underwent total internal reflection inside the lens 300a and exited through an opposite side surface. In this case, the angle $\gamma$ was 39 degrees. Therefore, the exit angle (90−$\gamma$) with respect to the central axis of the lens was 51 degrees.

The angles $\gamma$ of beams according to various inclination angles $\beta$ of the inclination surface of the lower surface of the lens were calculated by performing the aforementioned simulation with respect to the various angles, and the calculated angles $\gamma$ are shown in the graph of FIG. 16(a). The angles $\gamma$ in the graph of FIG. 16(a) were converted into the exit angles (90−$\gamma$) of light, and the converted exit angles (90−$\gamma$) are shown in the graph of FIG. 16(b).

Referring to FIG. 16(a) or (b), it can be seen that as the inclination angle $\beta$ increases, the angle $\gamma$ gradually increases, and that, in case of the inclination angle $\beta$ exceeding about 20 degrees, the total internal reflection of light occurs inside the lens as shown in FIG. 15(c). Meanwhile, in a case where the inclination angle $\beta$ is less than 5 degrees, the angle $\gamma$ gently increases as the inclination angle $\beta$ increases. However, in a case where the inclination angle $\beta$ is 5 degrees or more, the angle $\gamma$ relatively rapidly increases. In a case where the inclination angle $\beta$ is 15 degrees or more, the angle $\gamma$ converges into a substantially straight line.

According to the results of the simulation described above, in case of the inclination angle $\beta$ exceeding 20 degrees, the total internal reflection of light occurs inside the lens, thereby causing loss of light. Since the exit angle (90−$\gamma$) is also less than 70 degrees, light is focused near the central axis of the lens, thereby inhibiting achievement of uniform light.

Meanwhile, in a case where the inclination angle $\beta$ is between 10 to 20 degrees, the beam of light exits outwardly through the side surface of the lens without any total internal reflection. However, since the exit angle (90−$\gamma$) is less than 70 degrees, light is focused near the central axis of the lens, thereby inhibiting achievement of uniform light. On the other hand, in a case where the inclination angle $\beta$ is less than 10 degrees, the exit angle (90−$\gamma$) approximately exceeds 70 degrees, so that light can be preferably widely distributed.

Since flip-chip type LED chip is mounted directly on the circuit board, the size of the light emitting device can be decreased as compared with a conventional light emitting device using a package substrate. Accordingly, it is possible to slim the light emitting module. Further, since the size of the light emitting device 200a is small, the size of a concave portion 320 of the lens 300a can be decreased. Furthermore, it is possible to decrease the entire height of the lens 300a.

Although the present invention has been described in connection with the various exemplary embodiments, the present invention is not limited to the specific exemplary embodiments. The elements of the specific exemplary embodiments described above can be identically or similarly applied to other exemplary embodiments unless they depart from the spirit of the present invention.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light-emitting module, comprising:
   a circuit board;
   a light-emitting device disposed on the circuit board; and
   a lens disposed on the circuit board, the lens configured to distribute light emitted from the light-emitting device,
   wherein the lens comprises:
      a first surface comprising a concave portion having an incidence surface configured to receive light emitted from the light-emitting device,
      a second surface through which the light incident on the incidence surface of the concave portion exits, and
      a flange connecting the first surface and the second surface,
   wherein the light-emitting device is disposed within the concave portion of the lens,
   wherein the first surface of the lens comprises a flat surface surrounding the concave portion, and an inclination surface surrounding the flat surface and extending to the flange,
   wherein the lens further comprises leg portions disposed on the inclination surface between the flat surface and the flange, the leg portions of the lens being connected to the circuit board, and wherein the inclination surface has an inclination angle of less than 10 degrees with respect to the flat surface of the first surface of the lens.

2. The light-emitting module of claim 1, further comprising:
a reflective sheet disposed on the circuit board.

3. The light-emitting module of claim 1, wherein light is configured to exit from the flange at an exit angle greater than 70 degrees.

4. The light-emitting module of claim 1, wherein the light-emitting device comprises a chip-level light-emitting device.

5. The light-emitting module of claim 4, wherein the chip-level light emitting device is directly mounted on the circuit board.

6. The light-emitting module of claim 4, wherein the chip-level light-emitting device comprises:
a light-emitting diode (LED) chip; and
a wavelength conversion layer disposed on the LED chip, wherein the wavelength conversion layer is disposed on at least two surfaces of the LED chip.

7. The light-emitting module of claim 1, wherein a width of an entrance of the concave portion of the first surface of the lens is greater than a width of the light-emitting device.

8. The light-emitting module of claim 7, wherein the width of the entrance of the concave portion of the first surface of the lens is no more than two times greater than the width of the light-emitting device.

9. The light-emitting module of claim 7, wherein the width of the entrance of the concave portion of the first surface of the lens is no more than 3 mm.

10. The light-emitting module of claim 1, wherein the incidence surface of the lens is an inner surface of the concave portion.

11. The light-emitting module of claim 10, wherein the incidence surface of the lens comprises an upper end surface and a side surface continuing to an entrance of the concave portion from the upper end surface.

12. The light-emitting module of claim 11, wherein the concave portion of the first surface of the lens comprises a shape narrowing as the concave portion of the first surface of the lens extends upward from an entrance of the concave portion of the first surface of the lens to the upper end surface.

13. The light-emitting module of claim 12, wherein the side surface comprises an inclination surface having a constant slope from the entrance to the upper end surface, or the side surface comprises a curved inclination surface decreasing at a slope from the entrance to the upper end surface.

14. The light-emitting module of claim 11, wherein the upper end surface comprises a flat surface, a concave surface, or a convex surface.

15. The light-emitting module of claim 11, wherein the upper end surface comprises a light-scattering pattern.

16. The light-emitting module of claim 1, wherein the second surface of the lens comprises a concave surface disposed near a central axis of the lens, and a convex surface extending from the concave surface.

17. The light-emitting module of claim 1, wherein the second surface of the lens comprises a flat surface disposed near a central axis of the lens, and a convex surface extending from the flat surface.

* * * * *